United States Patent [19]
Shoji

[11] Patent Number: 5,858,874
[45] Date of Patent: Jan. 12, 1999

[54] METHOD OF FABRICATING SEMICONDUCTOR DEVICE HAVING STEP OF FORMING PLUG IN CONTACT HOLE

[75] Inventor: Hideyuki Shoji, Tokyo, Japan

[73] Assignee: NEC Corporation, Tokyo, Japan

[21] Appl. No.: 831,597

[22] Filed: Apr. 10, 1997

Related U.S. Application Data

[63] Continuation of Ser. No. 565,936, Dec. 1, 1995, which is a continuation of Ser. No. 299,640, Sep. 2, 1994, abandoned.

[30] Foreign Application Priority Data

Sep. 2, 1993 [JP] Japan ................................... 5-240318

[51] Int. Cl.$^6$ ................................................ H01L 21/4763
[52] U.S. Cl. .......................... 438/626; 438/638; 438/629; 438/645; 438/666; 438/668; 438/738
[58] Field of Search ..................................... 437/195, 738, 437/626, 631, 637, 629, 638, 645, 652, 666, 668, 675

[56] References Cited

U.S. PATENT DOCUMENTS

| | | | |
|---|---|---|---|
| 4,818,725 | 4/1989 | Lichtel, Jr. et al. | 437/203 |
| 5,328,553 | 7/1994 | Poon | 437/195 |
| 5,366,930 | 11/1994 | Kim | 437/195 |
| 5,369,054 | 11/1994 | Yen et al. | 437/195 |

FOREIGN PATENT DOCUMENTS

| | | | |
|---|---|---|---|
| 2611085 | 8/1988 | France | 437/233 |
| 63-122263 | 5/1988 | Japan . | |
| 0119732 | 1/1989 | Japan | 437/233 |
| 3253254 | 1/1991 | Japan . | |

OTHER PUBLICATIONS

Wolf et al., vol. I, Silicon Processing for the VLSI Era, Lattice Press, 1986 pp. 539–565.

*Primary Examiner*—John F. Niebling
*Assistant Examiner*—Lynne A. Gurley
*Attorney, Agent, or Firm*—Foley & Lardner

[57] ABSTRACT

A method of fabricating a semiconductor device includes the steps of forming an inter-layer insulating film, forming a contact hole in the inter-layer insulating film, forming a thin conductive film filling the contact hole and covering the inter-layer insulating film, and forming a contact plug filling the contact hole by etching the thin conductive film and thus exposing the surface of the inter-layer insulating film. The etching is conducted such that, from the time when a surface of the inter-layer insulating film is about to be exposed, the thin conductive film and the inter-layer insulating film are etched under substantially the same etching speed. Plug loss in the contact hole is suppressed so that wiring breakage in the contact hole can be prevented.

4 Claims, 8 Drawing Sheets

METHOD OF FABRICATING SEMICONDUCTOR DEVICE HAVING STEP OF FORMING PLUG IN CONTACT HOLE

This application is a continuation of application Ser. No. 08/565,936, filed Dec. 1, 1995, which is a continuation of application Ser. No. 08/299,640, filed Sep. 2, 1994, now abandoned.

BACKGROUND OF THE INVENTION

(1) Field of the Invention

The present invention relates to a method of fabricating semiconductor devices, and more particularly to a method of fabricating a semiconductor device involving a step of forming plugs in contact holes.

(2) Description of the Related Art

Figure 1A:
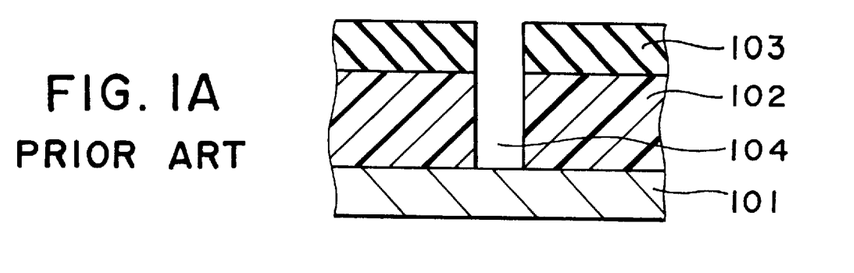
FIGS. 1A to 1D are fragmentary sectional views illustrating a prior art method of fabricating a semiconductor device (a first prior art)

A prior art method of forming a contact plug using a polysilicon film (hereinafter referred to as the first prior art) will be described with reference to FIGS. 1A to 1D. First, as shown in FIG. 1A, a BPSG (boronphosphosilicate glass) film 102 is grown on a silicon substrate 101. Then, photosensitive etching resist (hereinafter referred to as a photoresist) 103 is coated, and its portion corresponding to a contact hole formation area is removed by using a photolithographic technique. Then, a contact hole 104 is formed using a dry etching process, and thereafter the photoresist 103 is removed.

Figure 1B:
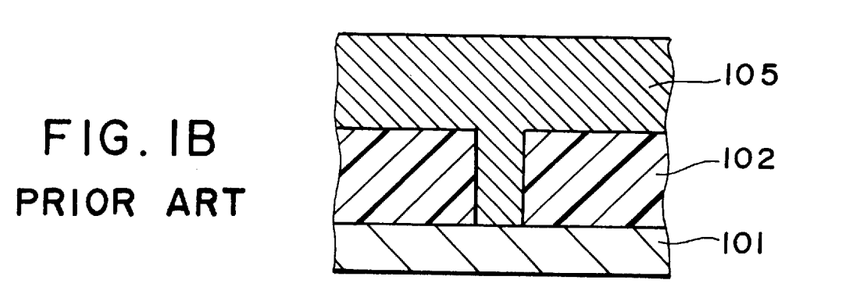
Figure 1C:
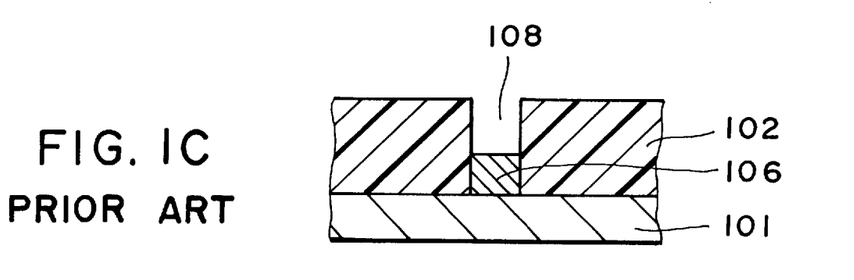
Figure 7:
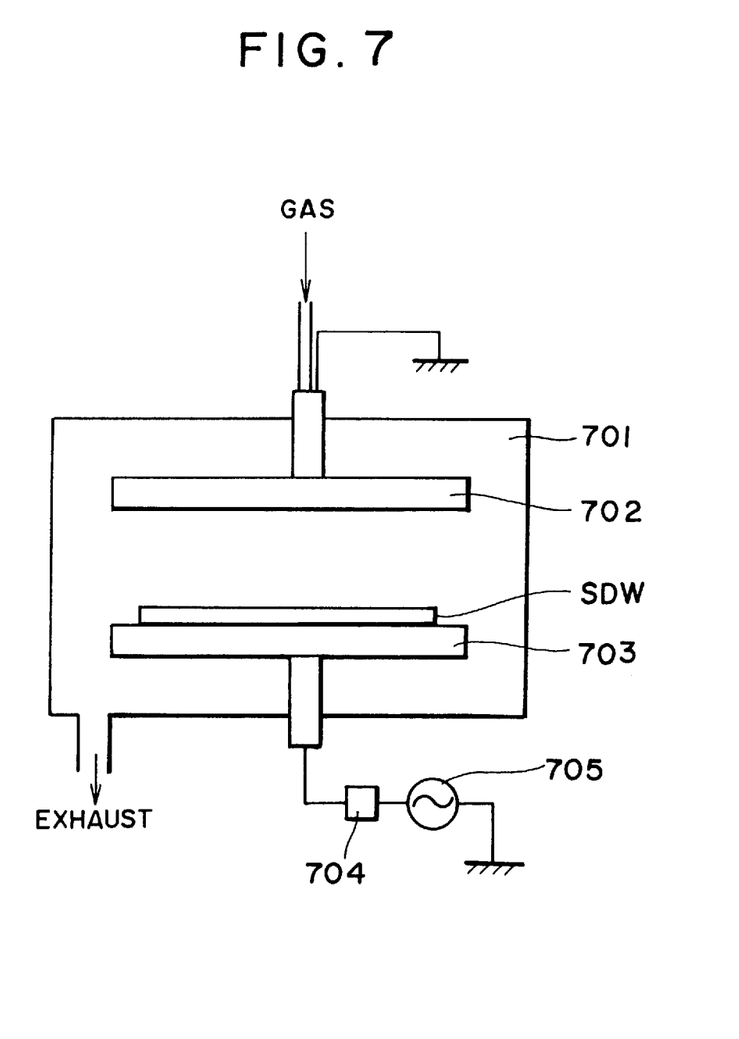
FIG. 7 is a schematic view showing a dry etching system used according to the invention and in the prior art.

Subsequently, as shown in FIG. 1B, a polysilicon layer 105 is grown such that it fills the contact hole 104 and has a substantially flat surface. Thereafter, this semiconductor wafer (SDW) is set on a lower electrode 703 of a dry etching apparatus which has a pair of upper and lower parallel electrodes 702 and 703 arranged in a chamber 701 as shown in FIG. 7. The lower electrode 703 is connected to a radio frequency (RF) power source 705 via a matching box 704. In this etching apparatus, a first stage of etching is carried out under the conditions of $SF_6$ set to 100 sccm, a pressure set to 360 mTorr and an RF power density set to 2.7 $W/cm^2$ until the residual film of the polysilicon film 105 on the BPSG film 102 becomes 0.1~0.2 $\mu$m. In a subsequent second stage of etching, the polysilicon film 105 is etched under the conditions of $CF_4$ set to 50 sccm, the pressure set to 360 mTorr and the RF power density set to 2.7 $W/cm^2$ until the BPSG film 102 is exposed, as shown in FIG. 1C. Thus, a contact plug 106 is formed.

Figure 1D:
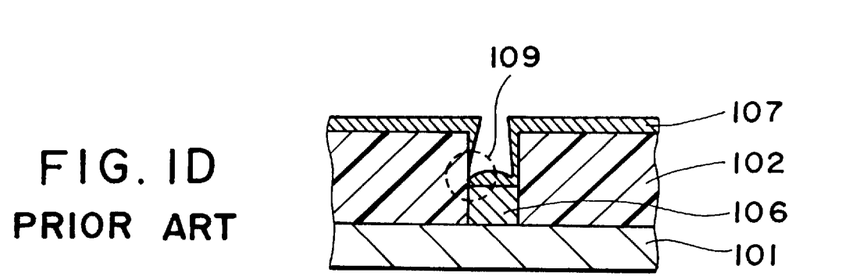

Finally, as shown in FIG. 1D, a silicide film 107 is formed using a spattering device or the like, and metal interconnects are formed.

In the above first prior art, great plug loss 108 is expected, as shown in FIG. 1C. Therefore, it is highly possible that the subsequent wiring formation results in breakage 109 of wiring as shown in FIG. 1D. The second prior art which has been intended to cope with this deficiency will be described with reference to FIGS. 2A to 2D.

Figure 2A:
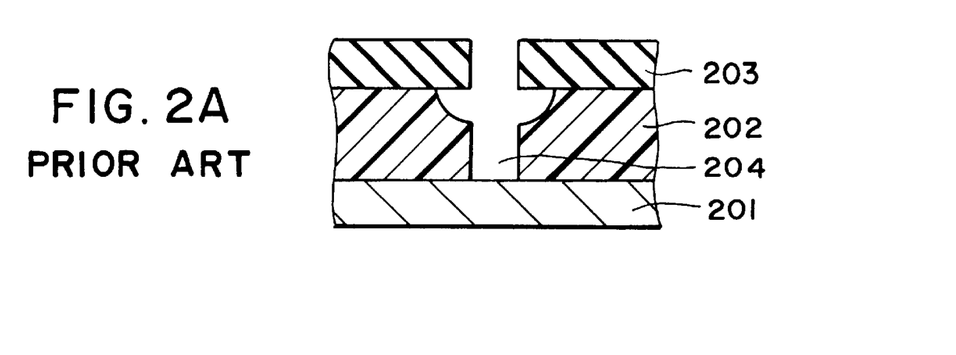
FIGS. 2A to 2D are fragmentary sectional views illustrating a modified prior art method of fabricating a semiconductor device (a second prior art)

First, as shown in FIG. 2A, a BPSG film 202 is grown on a silicon substrate 201, and then a photoresist 203 is coated and removed for a contact hole formation area using the photolithographic technique. Then, one-third to one-half of the thickness of the BPSG film 202 is wet etched, and the remaining BPSG film 202 is anisotropically dry etched, thus forming a contact hole 204. The resist 203 is then removed.

Figure 2B:
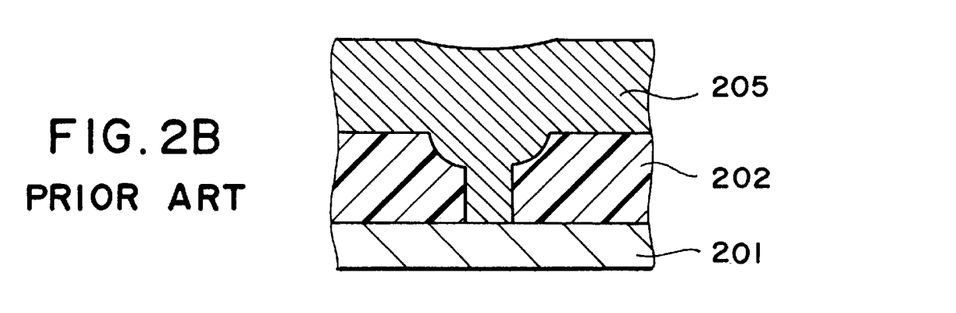
Figure 2C:
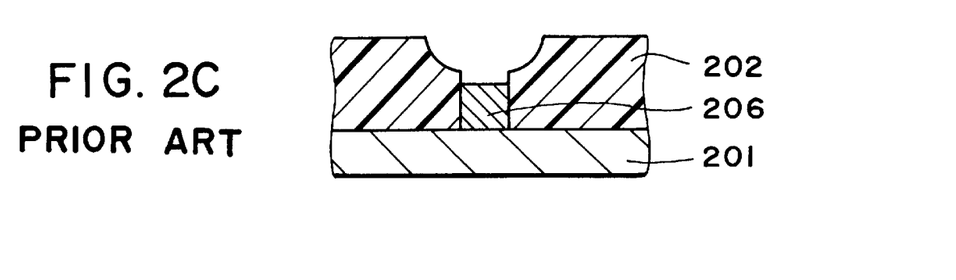
Figure 2D:
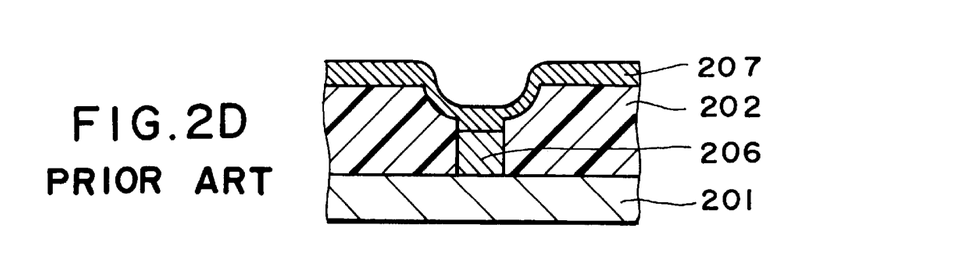

Then, as shown in FIG. 2B, a polysilicon film 205 is formed to fill the contact hole 204. Then, as shown in FIG. 2C, the polysilicon film 205 on the BPSG film 202 is dry etched, thus forming a contact plug 206. Finally, as shown in FIG. 2D, wiring is formed from a silicide film 207.

Figure 3:
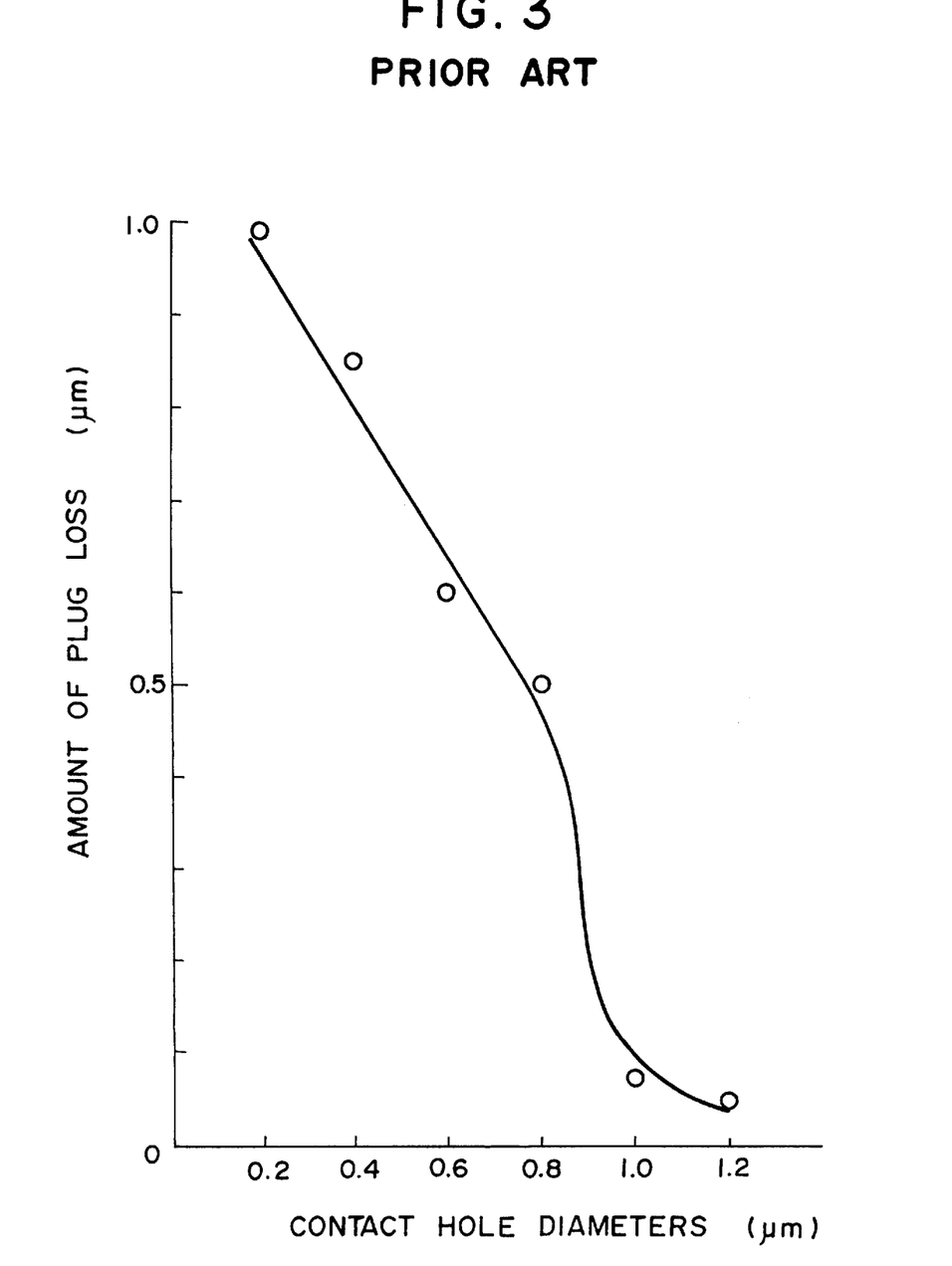
FIG. 3 is a graph showing the dependency of the plug loss amount on the contact hole diameter in the prior art.

In this contact plug formation process, the contact hole 204 is formed by isotropic wet etching so that the contact hole 204 has a tapered opening portion. It is thus possible to form a wiring interconnect free from breakage irrespective of slight plug loss generation.

Where a contact plug is formed in the above first prior art, the amount of plug loss in the contact hole is, as shown in FIG. 3, 0.075 $\mu$m with a contact hole diameter of 1.0 $\mu$m, 0.5 $\mu$m with a contact hole diameter of 0.8 $\mu$m, 0.6 $\mu$m with a contact hole diameter of 0.6 $\mu$m and 0.85 $\mu$m with a contact hole diameter of 0.4 $\mu$m. This means that the prior art process of contact plug formation has a problem in that the range of contact hole diameter which is free from breakage 109 of wiring is 1.0 $\mu$m or above and, if the contact hole diameter is less than 1.0 $\mu$m the process cannot be applied because of the possibility of the breakage 109 of wiring due to the increase in plug loss.

Figure 4:
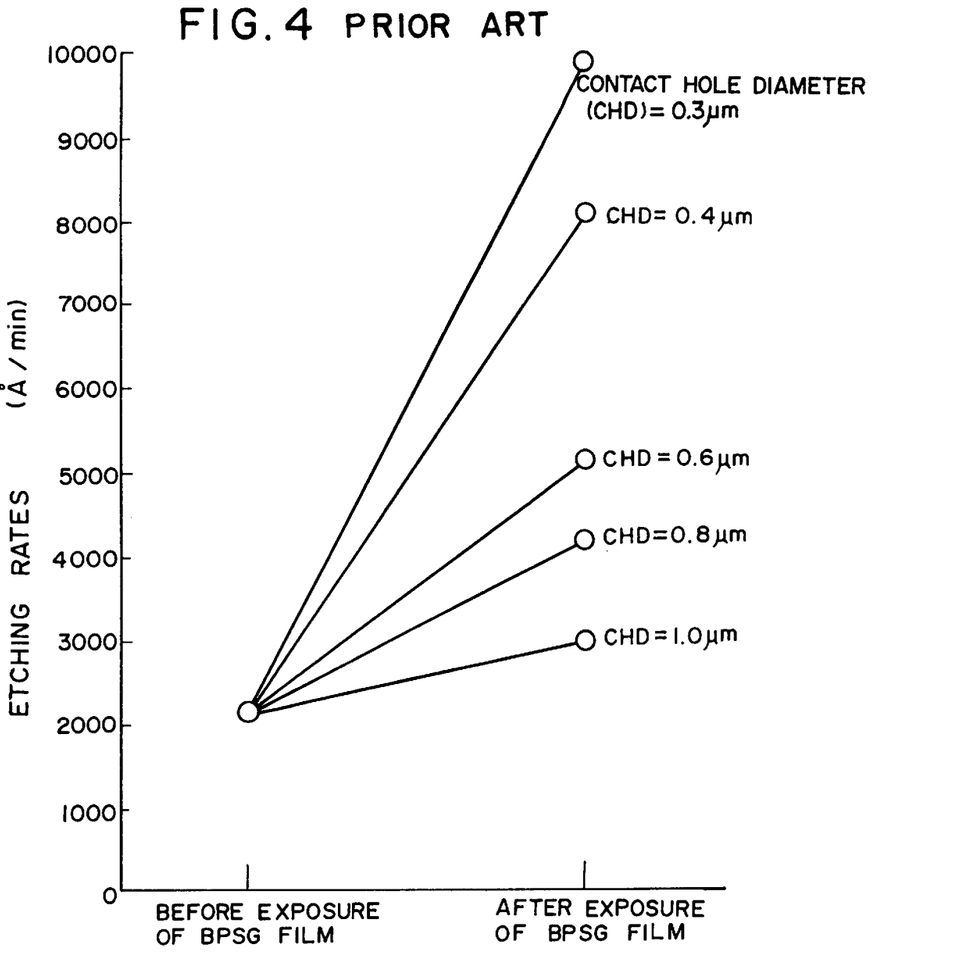
FIG. 4 is a graph showing the rate of etching of polysilicon film before and after the exposure of BPSG film with varied contact hole diameters.

The reason why the plug loss begins to occur as the contact hole diameter becomes less than 1.0 $\mu$m is that, when the BPSG film 102 underlying the polysilicon film 105 is exposed and the polysilicon film 105 remains only in the contact hole, there is a sudden increase in the rate of etching of the polysilicon film 105. Experiments conducted by the inventor reveal that under the conditions of the second stage etching in the prior art (i.e., when the rate of etching of the BPSG film is one half or below the rate of etching of the polysilicon film), the rate of etching of the polysilicon film is high when the film is present only in the contact hole compared to the case when the film is entirely covering the BPSG film, as shown in FIG. 4. This trend is more pronounced with smaller contact hole diameters and becomes highly significant when the contact hole diameter (CHD) becomes less than 0.4 $\mu$m. Within the accuracy of the currently adopted etching end detection technique, certain overetching is necessary in order to eliminate etching residue on the BPSG film. Therefore, great plug loss is prone particularly with contact plug of small size.

Further, in the first prior art process, as shown in FIG. 1B, the polysilicon film 105 is grown until it becomes flat over the entire semiconductor wafer surface before execution of the etching-back. However, with a contact hole diameter of 0.4 $\mu$m or below, it is necessary, in order to obtain the flatness, to grow the polysilicon film 105 to a thickness twice the contact hole diameter if the diameter is 0.4 $\mu$m and three times or above if the diameter is 0.3 $\mu$m to an aspect ratio of 3, for instance. Therefore, it is necessary to etch a very thick film to form a small size contact plug. This means that, in the formation of a small diameter contact plug, the reproducibility of etching is deteriorated, thus making the etching end detection far more difficult.

Figure 5:
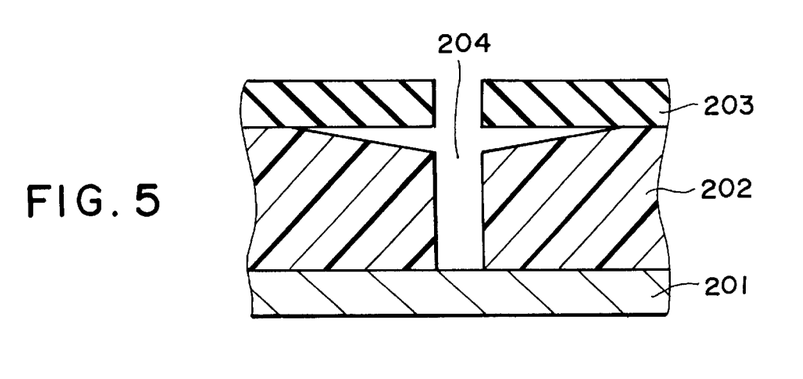
FIG. 5 is a sectional view for describing a problem inherent in the modified prior art shown in FIG. 2.

In the second prior art noted above, the above problem in the first prior art is solved to a certain extent. However, in the second prior art process, wet etching is adopted to form the contact hole 204. Therefore, if the photoresist 203 and the BPSG film 202 are in an imperfect adhesive state, that is, if they are not closely in contact with each other, the etching proceeds through the semiconductor wafer to a greater extent in the horizontal direction than in the vertical direction, as shown in FIG. 5, and therefore it has been difficult to form an isotropic contact hole as shown in FIG. 2A with good reproducibility. In addition, since the wet etching is used, there is a limitation imposed on the miniaturization of the semiconductor device.

SUMMARY OF THE INVENTION

An object of the present invention is, therefore, to overcome the problems existing in the prior art and to provide a method of fabricating a semiconductor device including a step of forming in a contact hole a contact plug in which the plug loss is suppressed and further the wiring breakage is prevented.

According to one aspect of the invention, there is provided a method of fabricating a semiconductor device comprising the steps of:

forming an inter-layer insulating film on a semiconductor substrate;

forming a contact hole in the inter-layer insulating film;

forming a thin conductive film filling the contact hole and covering an upper surface of the inter-layer insulating film; and forming a contact plug filling the contact hole by etching the thin conductive film and thus exposing the upper surface of the inter-layer insulating film, the etching being conducted such that, from a timing when at least a surface of the inter-layer insulating film is about to be exposed, the thin conductive film and the inter-layer insulating film are etched under substantially the same etching speed.

According to another aspect of the invention, the above method of fabricating a semiconductor device is characterized in that the thin conductive film is grown to a thickness meeting a condition $t = K \cdot d$ where d is a diameter of the contact hole, t is a thickness of the thin conductive film on the inter-layer insulating film, and K is a constant ranging from 1.1~1.5.

Figure 9:
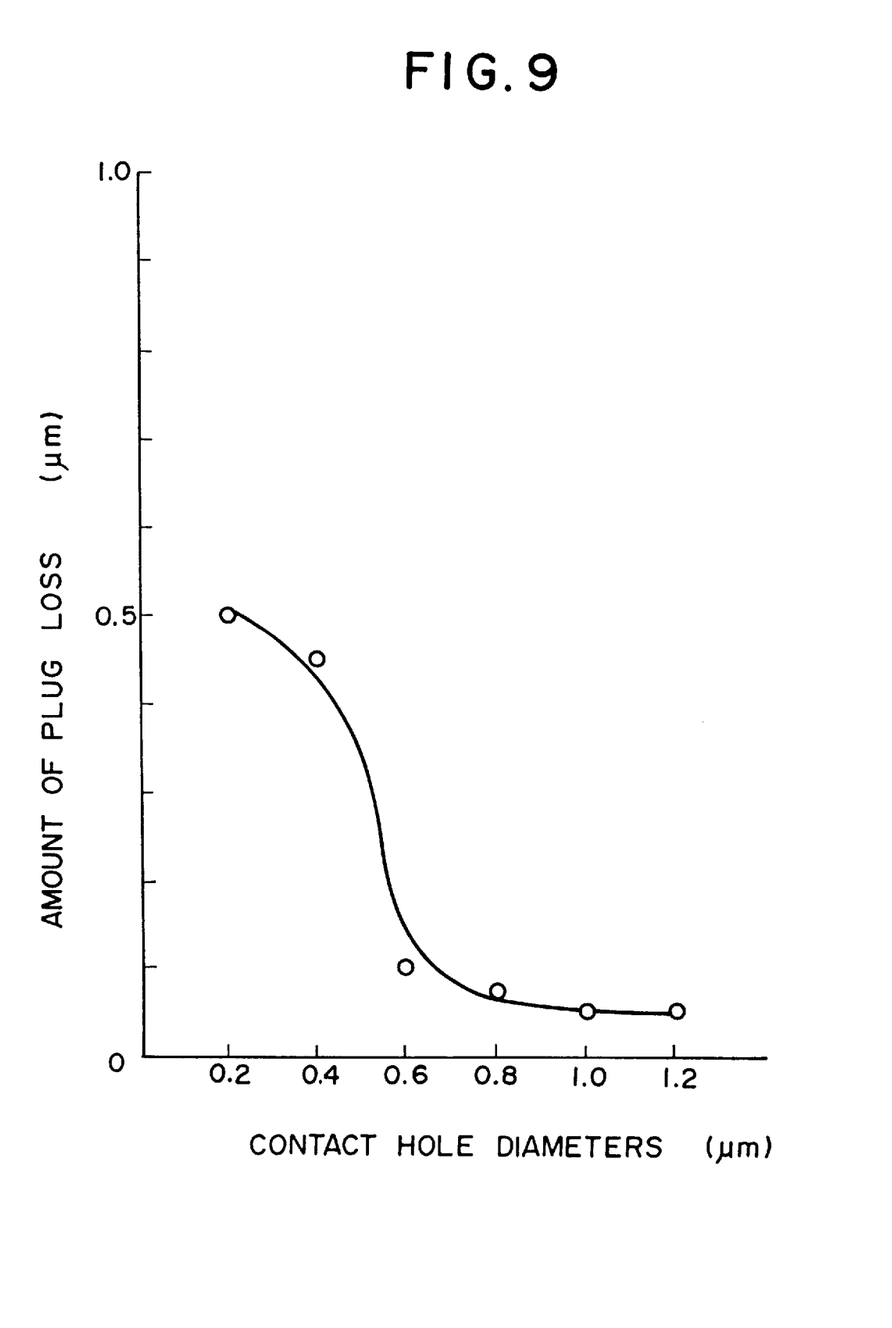
FIG. 9 is a graph showing the dependency of the plug loss amount on the contact hole diameter for describing the functions and effects of the invention.

It has been found by the inventor that, in a process of etching back a thin conductive film, if an etching condition is selected such that the rate of etching of the thin conductive layer is equal to that of an inter-layer insulating film, it is possible to suppress an increase in the rate of etching of the thin conductive film after the exposure of the inter-layer insulating film, thus permitting contact plug formation with less plug loss. FIG. 9 shows the data obtained when the contact hole diameter is changed in the etching-back process. As shown in FIG. 9, with contact hole diameters greater than about 0.6 μm, the plug loss is not substantial, and it is possible to etch the thin conductive film and the inter-layer insulating film substantially at the same rate. Thus, a satisfactory contact plug can be formed without a need of strict etching end detection.

However, where the contact hole diameter is further reduced to be less than 0.4 μm, the plug loss is increased, as seen in FIG. 9, even if the thin conductive film and the inter-layer insulating film are etched under the same etching conditions. In this case, therefore, it is difficult to form a highly reliable contact plug. According to the invention, a further measure is provided to cope with such a case. As described before, when the contact hole diameter is reduced, it is impossible to obtain flat surface unless the thickness of a thin conductive film deposited on the inter-layer insulating film is made large. According to the invention, positive use is made of the non-flatness of the film that is formed. More specifically, the etching-back is commenced in a state of surface with recesses present due to contact holes. By adopting this method, the following effects are obtainable.

(1) Since there is no need of etching back the thin conductive film having large thickness, it is possible to improve the reproducibility of the etching end detection.

(2) It is possible to directly reflect the shape of recesses formed in the thin conductive film surface, and it is possible to form a contact hole having a tapered opening portion. It is thus possible to form a contact plug with a structure less subject to wiring breakage.

By providing such additional measure, it is possible to form a highly reliable contact plug even with a contact hole with a diameter of 0.4 μm or below. In this case, the thin conductive film should have a thickness at least equal to a predetermined thickness because insufficient thickness increases the possibility of formation of voids in the contact plug. In addition, a thickness at least equal to a predetermined thickness is necessary for obtaining the effects as given in (1) and (2) above. According to the data from the experiments conducted by the inventor, it is possible to form a highly reliable contact plug by growing a thin conductive film having a thickness meeting a condition $t = K \cdot d$ where d is the contact hole diameter and d=0.2~0.4 μm, t is the thickness of the thin conductive film on the inter-layer insulating film, and K is a constant ranging from 1.1~1.5. By adequately selecting the value of K in the above range, it is possible to obtain a desired shape of the taper at edge portions of the contact hole.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be described with reference to the accompanying drawings.

FIGS. 6A to 6E are fragmentary sectional views illustrating sequential steps in the first embodiment of the method of fabricating a semiconductor device according to the invention.

Figure 6A:
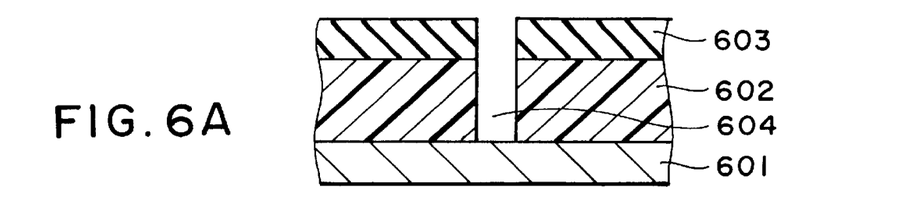
FIGS. 6A to 6E are fragmentary sectional views illustrating sequential steps in the fabrication method of a first embodiment of the invention.

First, as shown in FIG. 6A, a BPSG film 602 is formed as an inter-layer insulating film to a thickness of 1 μm on a silicon substrate 601. Then, a photoresist 603 is applied thereon and formed with an opening with a contact hole diameter of 0.6 μm using exposing and developing techniques. Thereafter, a contact hole 604 is formed by the dry etching process.

Figure 6B:
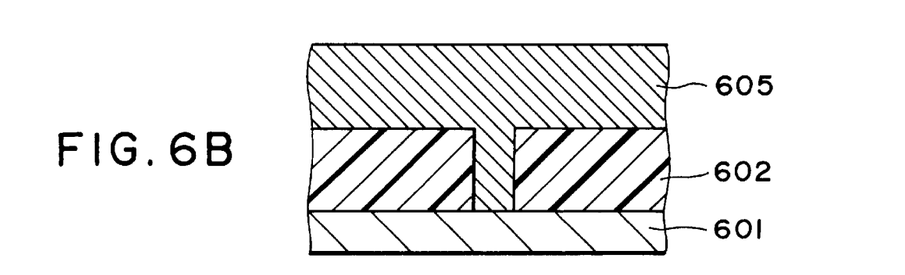
Figure 6C:
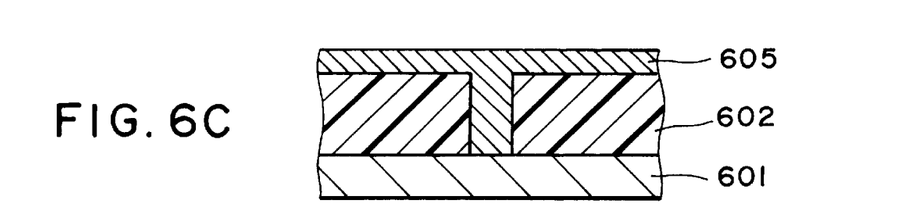
Figure 6D:
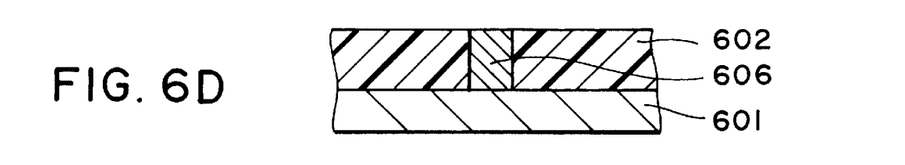
Figure 6E:
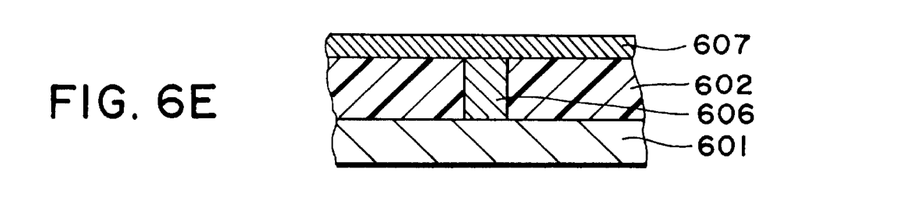

Then, the photoresist 603 is removed and, as shown in FIG. 6B, a polysilicon film 605 is grown to a thickness of 1.0 μm. Subsequently, this semiconductor wafer (SDW) is set on the lower electrode 703 of the dry etching apparatus having the pair of parallel upper and lower electrodes 702 and 703 in the chamber 701 as shown in FIG. 7, the lower electrode 703 being connected to the RF power source 705 via the matching box 704. In this dry etching apparatus, a first stage of etching is carried out under the conditions of $SF_6$ set to 100 sccm, the pressure set to 360 mTorr and the RF power density set to 2.7 W/cm². The etching is discontinued when the thickness of the polysilicon film 605 on the BPSG film 602 becomes 0.1~0.2 μm, as shown in FIG. 6C. Thereafter, a second state of etching of the polysilicon film 605 is carried out under the conditions of $CF_4$ set to 80 sccm, the pressure set to 250 mTorr and the RF power density set to 5.5 W/cm² until the BPSG film 602 is exposed, as shown in FIG. 6D. Finally, a wiring interconnect is formed from a silicide film 607, as shown in FIG. 6E.

In this embodiment the polysilicon film 605 is etched in two stages, the first stage and the second stage, in order to improve the overall etching efficiency by setting a high etching rate in the first etching stage which has no direct relation to the contact plug formation.

In this embodiment, the second stage of etching using $CF_4$ gas is carried out by setting a condition such that the polysilicon film 605 and the BPSG film 602 are etched at the same rate. Thus, even after the exposure of the BPSG film 602, the BPSG and polysilicon films can be etched substantially at the same rate. Thus, it is possible to form a contact plug 606 which is substantially flush with the surface of the BPSG film 602, as shown in FIG. 6D, thus eliminating the breakage of wiring. Further, since the polysilicon and BPSG films are etched substantially at the same rate even after the exposure of the BPSG film, no strict accuracy is required for the etching end detection, and the etching end can be readily detected by, for instance, monitoring the changes in the emission intensity of a light wavelength of 704 nm.

Figure 8A:
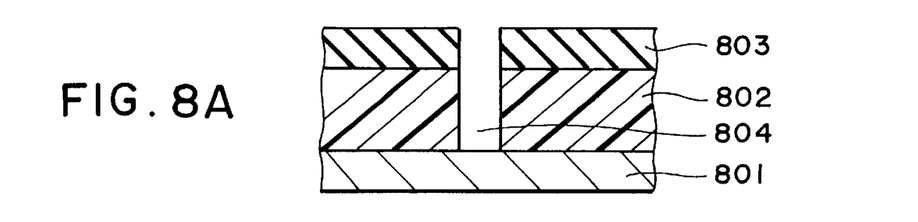
FIGS. 8A to 8F are fragmentary sectional views illustrating sequential steps in the fabrication method of a second embodiment of the invention.
Figure 8B:
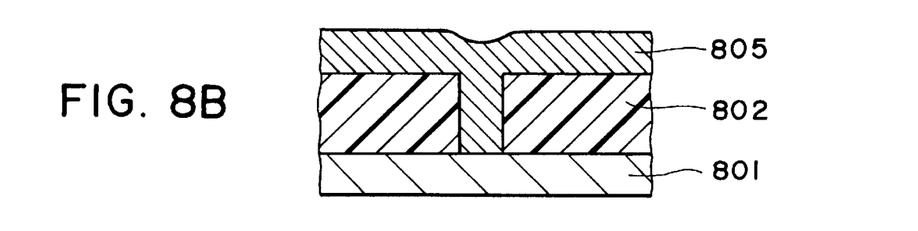

FIGS. 8A to 8F are fragmentary sectional views illustrating sequential steps of a second embodiment of the method of fabricating a semiconductor device according to the invention. First, as shown in FIG. 8A, a BPSG film 802 is formed as an inter-layer insulating film to a thickness of 1 μm on a silicon substrate 801 and then formed with an opening with a diameter of 0.3 μm by exposing and developing techniques. Then, a contact hole 804 is formed by the dry etching process. Then, the photoresist 803 is removed and, thereafter, a polysilicon film 805 is formed to a thickness of 0.4 μm, as shown in FIG. 8B. At this time, a recess is formed in a portion of the polysilicon film 805 over the contact hole 804.

Figure 8C:
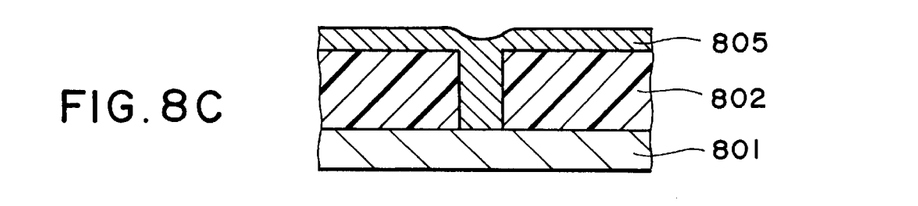
Figure 8D:
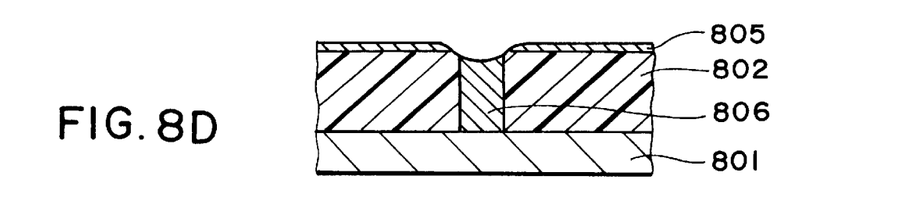
Figure 8E:
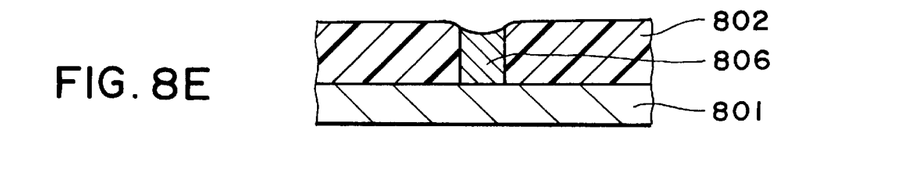
Figure 8F:
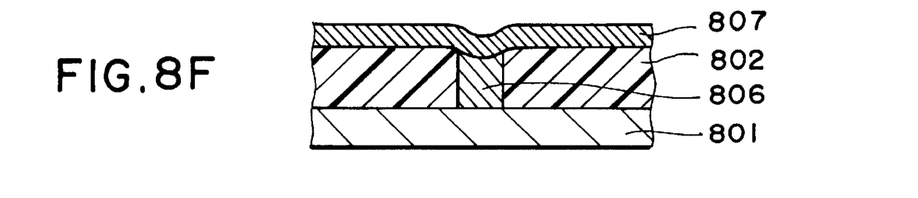

This semiconductor wafer (SDW) is then set on the lower electrode 703 in the dry etching system shown in FIG. 7, having the pair of parallel upper and lower electrodes 702 and 703 disposed in the chamber 701. In this system, the first stage of etching is carried out under the conditions of $SF_6$ set to 100 sccm, the pressure set to 360 mTorr and the RF power density set to 2.7 W/cm². As seen in FIG. 8C, the etching is discontinued when the thickness of the polysilicon film 805 on the BPSG film 802 becomes 0.1~0.2 μm. In this etching step, the shape of the recess in the surface of the polysilicon film 805 is preserved. Afterwards, the second stage of etching is carried out under the conditions of $CF_4$ set to 80 sccm, the pressure set to 250 mTorr and the RF power density set to 5.5 W/cm². Eventually, the contact hole end is exposed as shown in FIG. 8D. At this time, the polysilicon film 805 on the BPSG film 802 is present. Thus, with the contact hole diameter of 0.3 μm, the phenomenon of sudden plug loss increase from the zero plug loss state shown in FIG. 1D does not occur, and the BPSG film 802 in the contact hole edge area and the polysilicon film 805 in other area are etched at the same rate until the polysilicon film 805 no longer remains on the BPSG film. Thus, as shown in FIG. 8E, a contact hole with an edge taper is formed, thus forming a contact plug 806 with less plug loss. Finally, wiring interconnects are formed from a silicide film 807 as shown in FIG. 8F.

When the diameter d of the contact hole 804 is in a range of 0.2~0.4 μm, the thickness t for obtaining the recessed sectional profile of the polysilicon film on the contact hole is desirably held in the range of t=K·d (where K is a constant and ranges from 1.1~1.5).

If K is less than 1.1, void generation is possible in the polysilicon film in the contact hole, and thus plug loss generation is possible after the etching. If K exceeds 1.5, on the other hand, the thickness of film to be etched is increased such that the reproducibility of the etching end detection is unstable. Thus, the optimum range of K is K=1.1~1.5.

By selecting such a film thickness of the conductive film, it is possible to form a contact plug free from wiring breakage with respect to the upper layer wiring even with a contact hole with a diameter of 0.4 μm or below.

While some preferred embodiments of the invention have been described, it should be noted that various changes and modifications may be made. For example, it is possible to use tungsten in place of polysilicon as the plug formation material. Further, it is possible to use a silicon oxide film in place of the BPSG film as the inter-layer insulating film. Further, the invention is applicable not only to contact plugs on silicon substrates but also to contact plugs on wiring layers.

As has been described in the foregoing, in the method of fabricating semiconductor devices according to the invention, contact plugs are formed by etching the thin conductive layer covering an inter-layer insulating film and each contact hole and the inter-layer insulating film at the same etching rate. Thus, according to the invention it is possible to suppress plug loss generation and facilitates the etching end detection even with a contact plug with a contact diameter less than 0.8 μm, thus eliminating wiring breakage in the subsequent wiring formation.

Further, since according to the invention, the thickness of the thin conductive film on the inter-layer insulating film is set to be small and the etching-back is commenced with a recess formed in a thin conductive film portion over each contact hole, it is possible to obtain good reproducibility of the etching end detection. Further, a contact hole with a tapered end can be formed. Thus, it is possible to provide a contact structure, in which wiring breakage does not easily occur.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating a semiconductor device comprising:

forming an inter-layer insulating film on a semiconductor substrate;

forming a contact hole in said inter-layer insulating film having a greatest lateral dimension of no more than approximately 0.6 microns;

forming a conductive film which fills said contact hole and covers an upper surface of said inter-layer insulating film, said conductive film having a thickness t such that t=K·d, where d is the length of said greatest lateral dimension and K is a constant in the range of 1.1 to 1.5; and forming a contact plug filling said contact hole by etching said conductive film to expose the upper surface of said inter-layer insulating film, said etching being conducted such that, from a time when at least a surface of said inter-layer insulating film is about to be exposed, said conductive film and said inter-layer insulating film are etched at substantially the same etching speed such that a recess is formed on a surface of said contact plug.

2. The method of fabricating a semiconductor device according to claim 1, wherein an edge taper is formed on the surface of said contact plug when said conductive film having the recess formed thereon is etched.

3. The method of fabricating a semiconductor device according to claim 2, further comprising the step of selecting said inter-layer insulating film from a group consisting of borophosphosilicate film and silicon oxide film and said conductive film from a group consisting of polysilicon film and tungsten film.

4. The method of fabricating a semiconductor device according to claim 1, further comprising the step of selecting said inter-layer insulating film from a group consisting of borophosphosilicate film and silicon oxide film and said conductive film from a group consisting of polysilicon film and tungsten film.

* * * * *